United States Patent [19]

Dennison et al.

[11] Patent Number: 4,965,221
[45] Date of Patent: Oct. 23, 1990

[54] SPACER ISOLATION METHOD FOR MINIMIZING PARASITIC SIDEWALL CAPACITANCE AND CREATING FULLY RECESSED FIELD OXIDE REGIONS

[75] Inventors: Charles H. Dennison; Fernando Gonzalez, both of Boise, Id.

[73] Assignee: Micron Technology, Inc., Boise, Id.

[21] Appl. No.: 322,932

[22] Filed: Mar. 15, 1989

[51] Int. Cl.$^5$ ............................................. H01L 21/76
[52] U.S. Cl. ....................................... 437/70; 437/67; 437/69; 437/72
[58] Field of Search ......................... 437/69, 67, 72, 70

[56] References Cited

U.S. PATENT DOCUMENTS

| H204 | 2/1987 | Oh et al. ................................. | 437/70 |
|---|---|---|---|
| 4,435,446 | 3/1984 | Marston et al. ........................ | 156/662 |
| 4,472,240 | 9/1984 | Kameyama ............................. | 156/648 |
| 4,538,343 | 9/1985 | Pollack .................................... | 437/70 |
| 4,845,048 | 7/1989 | Tamaki .................................... | 437/67 |
| 4,923,563 | 5/1990 | Lee .......................................... | 437/72 |

FOREIGN PATENT DOCUMENTS

| 61-32540 | 2/1986 | Japan ....................................... | 437/62 |
|---|---|---|---|
| 191046 | 8/1986 | Japan ....................................... | 437/72 |
| 61-247051 | 11/1986 | Japan ....................................... | 437/72 |
| 81041 | 4/1987 | Japan ....................................... | 437/70 |
| 232143 | 10/1987 | Japan ....................................... | 437/70 |
| 100743 | 5/1988 | Japan ....................................... | 437/70 |
| 202935 | 8/1988 | Japan ....................................... | 437/70 |
| 2023934 | 8/1988 | Japan ....................................... | 437/70 |
| 35929 | 2/1989 | Japan ....................................... | 437/70 |
| 2198882 | 6/1988 | United Kingdom ................... | 437/70 |

Primary Examiner—Olik Chaudhuri
Assistant Examiner—Ourmazd S. Ojan

[57] ABSTRACT

A modification of the LOCal Oxidation of Silicon (LOCOS) isolation process, whereby prior to the oxidation of silicon substrate that is exposed upon etching the protective CVD nitride layer, a conformal layer of CVD oxide is deposited on the surface of the array. Following an anisotropic etch of the conformal layer, a portion of the conformal layer remains about the peripheries of the etched apertures within the nitride layer. These "spacers" will serve as an anti-encroachment device during field oxide growth and physically offset a subsequent silicon etch. Following a potassium hydroxide etch, which creates sloped-wall trenches in the array regions where silicon substrate is unprotected, the array receives a field implant. The spacers prevent the implanting of the channel-stop impurity near the active areas. Following the implant process, the array is subjected to a wet oxidation process which grows the field oxide regions. Oxide growth is allowed to proceed until the oxide thickness is approximately triple the original depth of the trenches. Following the wet oxidation, the field oxide is etched back with dilute hydrofluoric acid to the point where the upper surface of the field oxide is coplanar with the active areas. This modified LOCOS process provides fully-recessed field oxide regions, dramatically reduces the size of the bird's beak region, and virtually eliminates the problem of channel-stop implant encroachment.

11 Claims, 7 Drawing Sheets

SPACER ISOLATION METHOD FOR MINIMIZING PARASITIC SIDEWALL CAPACITANCE AND CREATING FULLY RECESSED FIELD OXIDE REGIONS

FIELD OF THE INVENTION

This invention relates to semiconductor manufacturing technology and, more specifically, to the growth of field oxide regions on a silicon wafer which serve to isolate devices in an integrated circuit array. The focus of the invention is a technique for creating recessed field oxide regions so as to maintain a higher degree of planarity within the array.

BACKGROUND OF THE INVENTION

Within the realm of semiconductor manufacturing technology, the trend toward ever-increasing device density, accompanied by corresponding decreases in device dimensions seems unlikely to abate in the foreseeable future.

FIG. 1 is a cross-section of the isolation geometry that is created for high-performance MOS arrays utilizing a process known as LOCal Oxidation of Silicon (LOCOS). LOCOS has become the standard device isolation technique, due to the semi-recessed topography of the field oxide 11, low defect density, and the self-aligning nature of the field implant in the n-channel field regions 13. However, with conventional LOCOS technology, precious array area is wasted in the thin-to-thick oxide transition regions known as the "bird's beak" regions 15. The very gradual slope of the bird's beak region not only wastes space, but also hampers subsequent fine line lithography operations which, for VLSI devices, is best suited to planar surface topography.

The loss of array area in the bird's beak regions is exacerbated by the lateral diffusion of the field implant into the active areas 17. As a result of this phenomenon, the substrate doping is effectively increased in the encroachment region 19 near field edges. Consequently, threshold voltage increases near device edges, and the full device width is unavailable for source-drain current. The usual manifestation of this "narrow channel effect" is an increase in apparent device threshold voltage as the channel width decreases.

If higher packing densities are to be achieved for VLSI devices, it is clear that future approaches to isolation technology must reduce both physical and electrical encroachment and achieve a greater degree of topography planarity A number of approaches have been proposed as either an alternative or a modification to the LOCOS process.

One of the more basic improvements to LOCOS which results in somewhat more planar surface topography and a reduction in the size of the bird's beak region is the etchback process. The crosssectional geometry resulting from this process is depicted in FIG. 2. The effectiveness of this technique, however, is limited by two factors—an increase in the effective size of the field implant encroachment region 19 and the degree of remaining surface nonplanarity following the etchback.

Another simple modification to LOCOS, dubbed SILO, results in the cross-sectional profile depicted in FIG. 3. A thin silicon nitride film formed by plasma nitridation or ion implantation is used to either replace or underlay the usual silicon nitridesilicon oxide bilayer used for conventional LOCOS. Although the fabrication process is complicated somewhat by some extra wet cleaning steps, the bird's beak region is reduced in size and lateral field encroachment region is reduced in size because of the reduced temperature cycle needed to grow the field oxide.

Several of the problems associated with LOCOS were ameliorated with a Side Wall Masked Isolation (SWAMI) technique developed at Hewlett Packard Laboratories. The field isolation geometry depicted in FIG. 4 is characteristic of that produced with the SWAMI process. This improvement to LOCOS minimizes lateral oxidation and also provides a planar surface topography with steeper oxide-to-silicon isolation boundary 41. However, the SWAMI process adds a great deal of complexity to the fabrication process and can lead to increased defect density.

Another modified LOCOS technique which produces a nearly planar surface topography is the use of potassium hydroxide to etch the field regions prior to thermally growing the oxide. The field isolation geometry depicted in FIG. 5 is representative of that produced with this process. Such a technique results in fully-recessed field oxide regions 11. Unfortunately, lateral oxidation with this technique is greater than with standard LOCOS. Additionally, true planarity is not achieved due to the formation of a "bird's head" 51 during the thermal growth of the field oxide.

Although all of the techniques described above provide certain improvements to the standard LOCOS process, none rectify the problem of field implant encroachment.

SUMMARY OF THE INVENTION

By means of a significant modification to the LOCOS process, the present invention provides fully-recessed field oxide regions with very-nearly planar surface topography, significantly reduces the size of the bird's beak region, and substantially reduces the problem of field (channel-stop) implant encroachment.

As with the conventional LOCOS isolation technique, the process begins with the thermal growth a pad oxide layer, followed by the deposition of a CVD nitride layer, masking of the nitride layer, etching of the nitride layer, and stripping of the mask. At this point the process diverges from conventional LOCOS technology. A conformal spacer-material layer of oxide or polycrystalline silicon is deposited over the patterned array. The conformal layer is then anisotropically etched in order to leave CVD oxide spacers at the edges of the perforations in the nitride layer. The existence of the spacers places the field implant material further away from the future active areas, thus minimizing parasitic junction sidewall capacitance in the completed array. The array is then subjected to a silicon etch, preferably using potassium hydroxide, which etched the exposed silicon substrate such that the trenches created have sloped sides. If the spacers are left in place at the time the exposed silicon is subjected to a wet oxidation process, they tend to slow the lateral diffusion of the field implant. Field encroachment is somewhat greater if the spacers are removed prior to field oxidation. In any case, oxidation is allowed to proceed to a point where the oxide thickness is considerably greater than the desired final thickness which would provide planarity throughout the array. Using dilute hydrofluoric acid, the superelevated field oxide is etched back to the desired thickness. The surface topography which results from this new process is very nearly planar, due primarily to the etchback rate differentials throughout the field oxide growth.

Several variations of the aforementioned process are possible. For example, either an anisotropic etch or an isotropic etch may be used in place of the potassium hydroxide etch. The preferred embodiment of the invention, however, uses a potassium hydroxide etch because of the resultant sloped-wall trenches.

If no yield implant is to be made prior to field oxidation, polycrystalline silicon may be used for the conformal layer, rather than CVD oxide. In this case, the spacers merely serve to pattern the pad oxide, which must then be removed prior to the etching of the silicon substrate. During the etch of the silicon substrate with potassium hydroxide etch, the spacers are etched away while the sloped-wall trenches are being formed Nevertheless, the pad oxide maintains the sloped-wall geometry of the trenches that are formed. Field oxidation then proceeds as heretofore explained.

BRIEF DESCRIPTION OF THE DRAWINGS

FIGS. 6 through 12 depict the growth of field oxide regions on a silicon substrate in accordance with the present invention.

FIG. 1 is a cross-sectional view depicting the field-isolation geometry characteristic of the conventional LOCOS process;

FIG. 2 is a cross-sectional view depicting the field-isolation geometry characteristic of the LOCOS process followed by an etchback;

FIG. 3 is a cross-sectional view depicting the field-isolation geometry characteristic of the SILO process;

FIG. 4 is a cross-sectional view depicting the field-isolation geometry characteristic of the SWAMI process;

FIG. 5 is a cross-sectional view depicting the field-isolation geometry characteristic of the fully-recessed LOCOS technique;

FIG. 6 is a cross-sectional view of silicon substrate at a location where active area field oxide spacing is to be grown, following the growth of pad oxide and the deposition of CVD silicon nitride;

FIG. 7 is a cross-sectional view of the substrate region depicted in FIG. 6, following the deposition of a conformal spacer-material layer;

FIG. 8 is a cross-sectional view of the substrate region depicted in FIG. 7, following an anisotropic spacer etch;

FIG. 10 is a cross-sectional view of the substrate region depicted in FIG. 9A, following a field implant;

FIG. 11 is a cross-sectional view of the substrate region depicted in FIG. 10, following the wet oxidation of the exposed silicon;

FIG. 12 is a cross-sectional view of the substrate region depicted in FIG. 11, following a hydrofluoric acid etchback.

PREFERRED EMBODIMENT OF THE INVENTION

Figure 1:
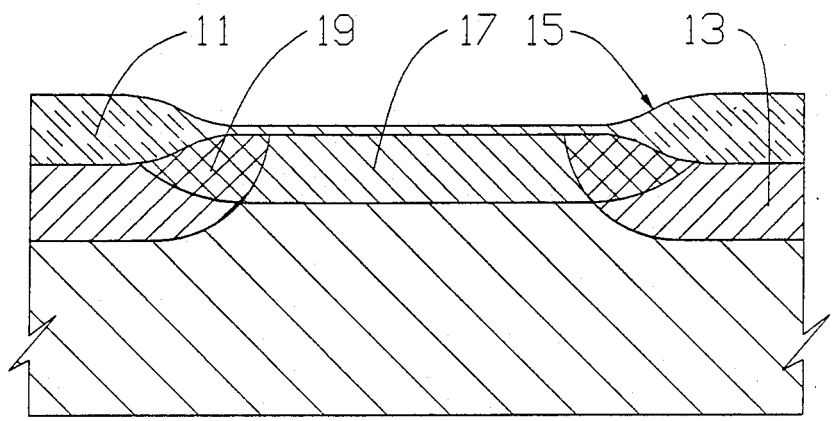
FIGS. 1 through 5 depict field-isolation geometries produced by certain prior-art techniques.
Figure 2:
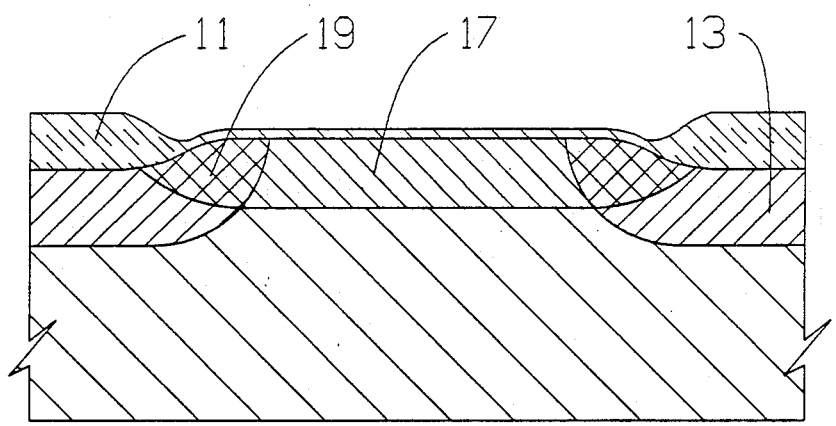
Figure 3:
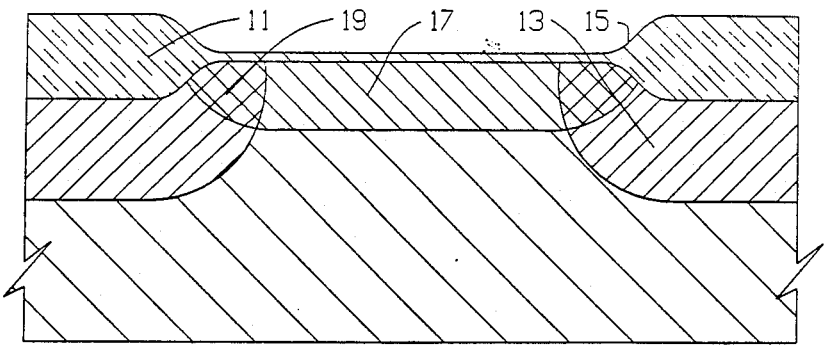
Figure 4:
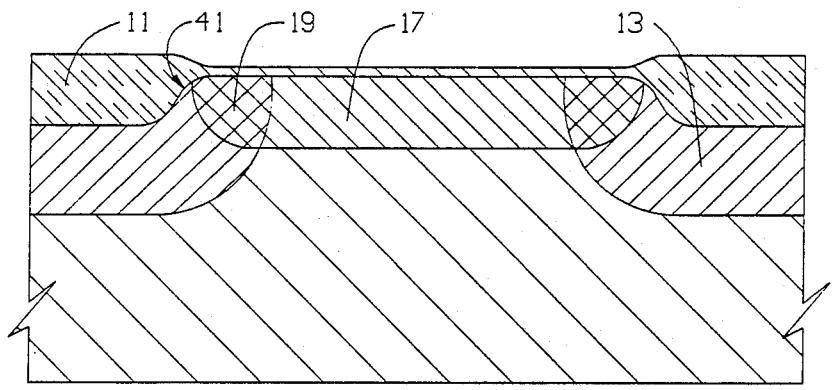
Figure 5:
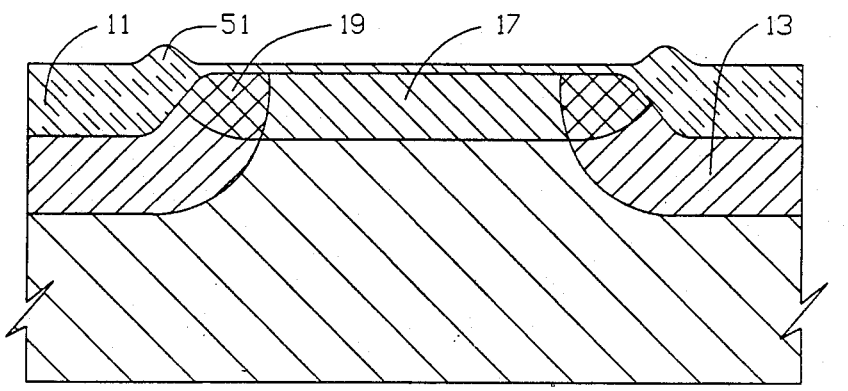
Figure 6:
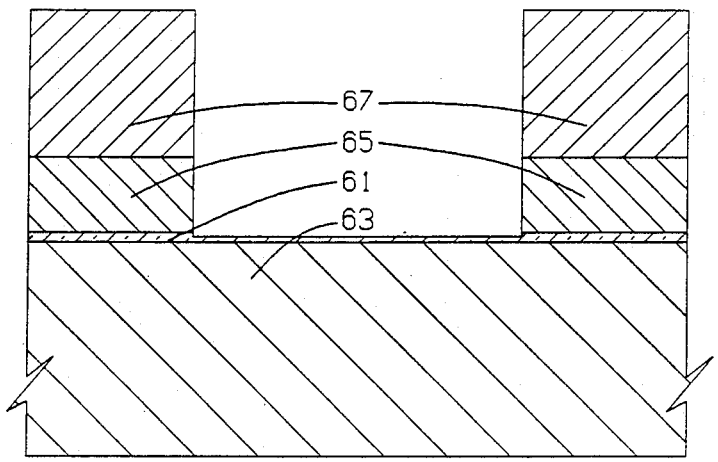

Referring now to FIG. 6, the spacer isolation method of producing field oxide isolation regions between active areas within a silicon semiconductor array begins with the same steps that are used for the conventional LOCal Oxidation of Silicon (LOCOS) process. A pad oxide layer 61 is grown on a silicon substrate 63. A CVD silicon nitride layer 65 is then deposited on top of pad oxide layer 61. The future active areas with the array are then masked with a photoresist mask 67, following which the unmasked portions of nitride layer 65 are etched. Following the etching of nitride layer 65, photoresist mask 67 is stripped from the array.

Figure 7:
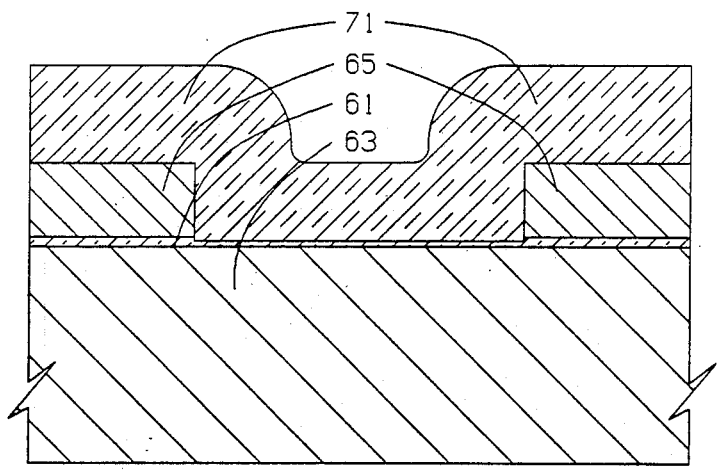

Referring now to FIG. 7, a conformal layer 71 of suitable spacer material, ranging in thickness from 1,000 to 5,000 angstroms, is deposited over the array. Although CVD oxide is deemed the desired material if a channel-stop impurity is to be implanted prior to field oxidation, other materials, such as polycrystalline silicon may be used if a field implant is not used prior to field oxidation.

Figure 8:
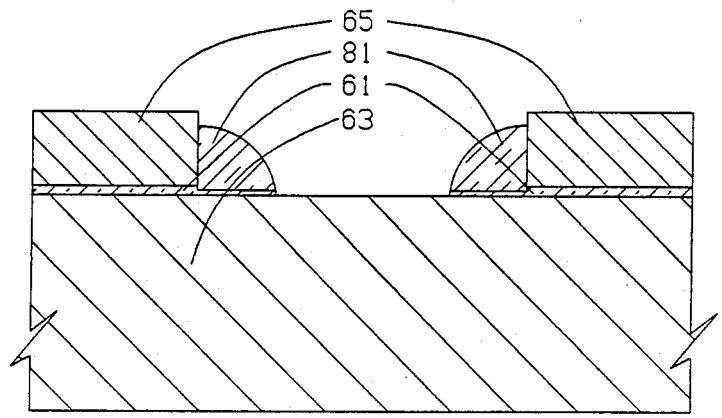

Referring now to FIG. 8, the array is subjected to an anisotropic etch, which etches away all of conformal layer 71 except for spacers 81.

Figure 9A:
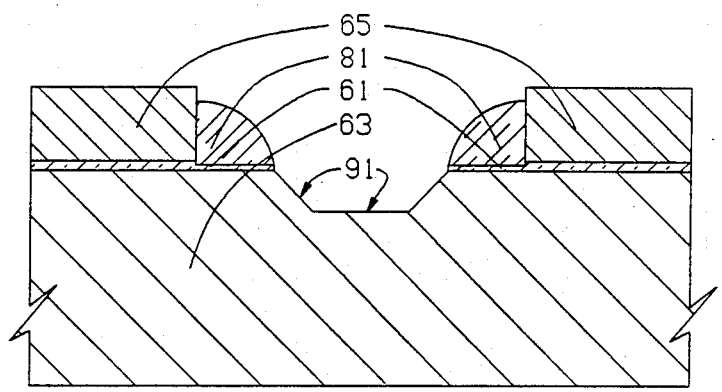
FIG. 9A is a cross-sectional view of the substrate region depicted in FIG. 8, following a potassium hydroxide silicon etch.

Referring now to FIG. 9A, the array is subjected to a potassium hydroxide bath, which etches sloped-side trenches in the exposed silicon substrate. Trench 91 is representative of those which are formed within the array For a given desired final field oxide thickness, the depth of the trenches should be approximately 35 percent of the desired final thickness.

Figure 9B:
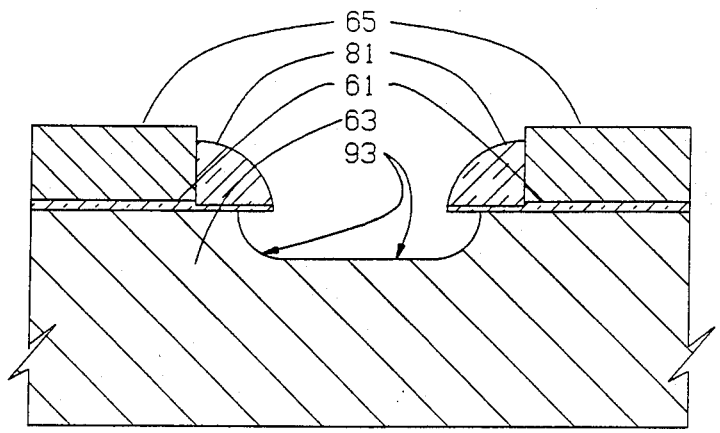
FIG. 9B is a cross-sectional view of the substrate region depicted in FIG. 8, following an isotropic silicon etch.

FIG. 9B depicts a trench in a silicon substrate formed by an isotropic silicon etch. Although the potassium hydroxide etch—the results of which are depicted in FIG. 9A—is the preferred trench etching method, the isotropic silicon etch creates undercut trenches which, although not of ideal configuration, are usable.

Figure 9C:
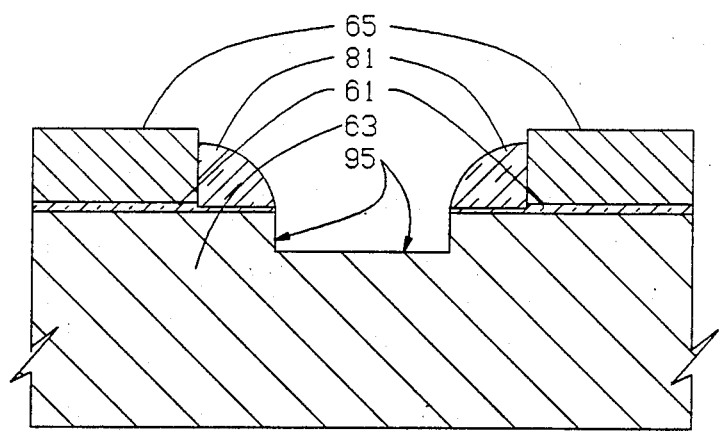
FIG. 9C is a cross-sectional view of the substrate region depicted in FIG. 8, following an anisotropic silicon etch.

FIG. 9C depicts a trench 95 in a silicon substrate formed by an anisotropic silicon etch. Once again, although the potassium hydroxide is the preferred etch, the anisotropic etch provides usable parallel-walled trenches.

Figure 10:
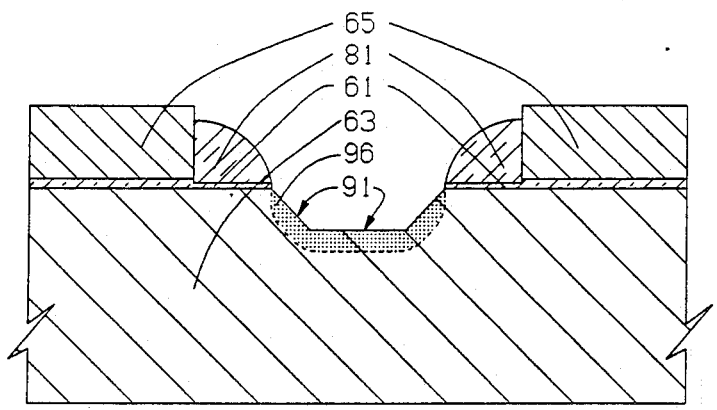

Referring now to FIG. 10, a field stop impurity has been implanted in the shaded region 96 of the silicon substrate 63 which lines trench 91.

Figure 11:
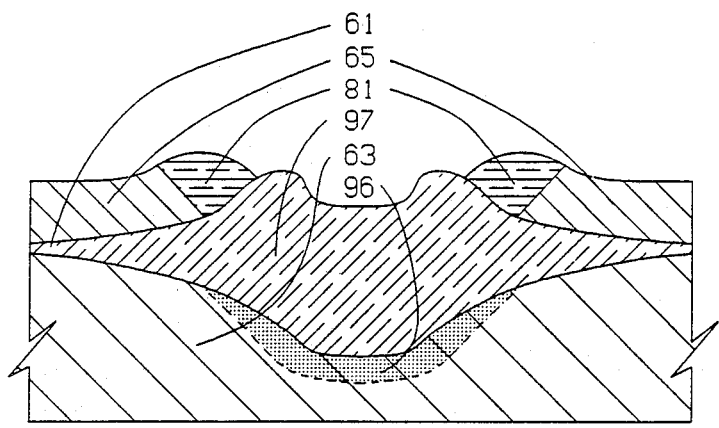

Referring now to FIG. 11, the array, etched as depicted in FIG. 9A, is subjected to a wet oxidation process. The exposed silicon in the sloped-wall trench 91 has oxidized until field oxide 97 has grown to a thickness that is nearly four times as great as the original depth of the trench 91. The thickness of field oxide above the surface of the array will then be approximately twice as great as the original depth of trench 91. The implanted shaded region 96 has grown in size due to diffusion during the oxidation process.

Figure 12:
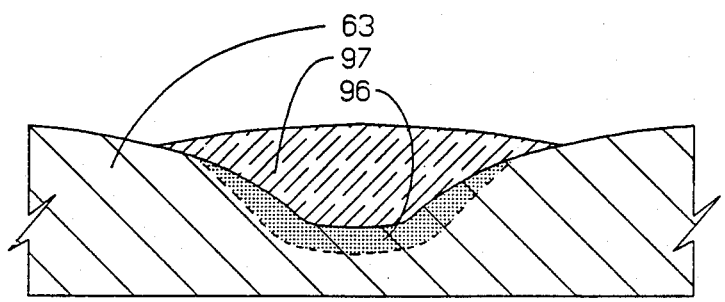

Referring now to FIG. 12, the final step in the isolation process is the etchback of the field oxide 97 to the final configuration. It will be noted that the surface of the field oxide region 97 is essentially coplanar with the upper surface of the silicon substrate 63. It will be also noted that the field implant, represented by shaded region 96, has not diffused appreciably beyond the limits of the field oxide region 97.

Figure 13:
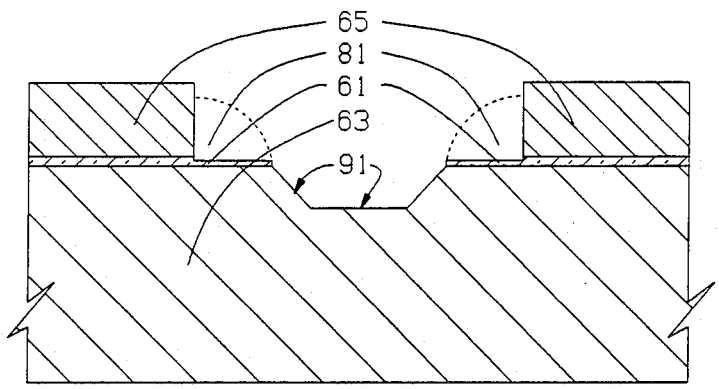
FIG. 13 is a cross-sectional view of a substrate region which had polycrystalline silicon spacers, shown subsequent to a potassium hydroxide etch.

Referring now to FIG. 13, if no field implant is to be made prior to field oxidation, polycrystalline silicon may be used for conformal layer 71, rather than CVD oxide. In this case, spacers 81 (the former position of which is indicated by the dashed lines) merely serve to pattern pad oxide 61, which must then be removed prior to the etching of the silicon substrate 63. During the etch of the silicon substrate 63 with potassium hydroxide, spacers 81 are etched away while sloped-wall trench 91 is being formed Nevertheless, since the pad oxide 61 is not rapidly etched by the potassium hydroxide, the sloped-wall geometry of the trenches 91 is maintained As with the use of spacers 81 formed from CVD oxide, the trench rim remains spaced away from the etched CVD nitride layer 65. Field oxidation then proceeds as heretofore explained.

Although only the preferred embodiment of the invention has been described herein, it will be apparent to one skilled in the art that changes and modifications may be made thereto without departing from the spirit and the scope of the invention as claimed.

I claim:

1. A spacer isolation method for minimizing parasitic sidewall capacitance and creating fully-recessed field oxide isolation regions within an integrated circuit array fabricated on a silicon substrate, comprising the following steps:
   (a) growth of a pad oxide layer on the upper surface of the silicon substrate;
   (b) deposition of a silicon nitride layer on top of the pad oxide layer;
   (c) deposition of a photoresist mask on top of the silicon nitride layer, thus defining masked and unmasked portions of the silicon nitride layer;
   (d) etching of the unmasked portions of the nitride layer to expose the pad oxide below;
   (e) stripping of the photoresist mask;
   (f) deposition of a conformal spacer-material layer over the surface of the array;
   (g) anisotropic etching of the spacer-material layer to such an extent that the pad oxide which was exposed prior to the deposition of the spacer-material layer is etched away to expose the silicon substrate below, and a portion of the spacer-material layer remains as spacers about the peripheries of apertures etched within the nitride layer;
   (h) etching of exposed silicon substrate within the array to form trenches in the silicon substrate;
   (i) implanting of a field-stop impurity in the silicon substrate directly beneath the trenches;
   (j) oxidation of the silicon substrate that forms the walls and floor of the trenches to such an extent that silicon oxide has grown to a level that is higher than that of the surrounding silicon nitride-masked silicon substrate; and
   (k) etching of the silicon oxide to the point where it is essentially coplanar with the surrounding silicon substrate.

2. The method of claim 1, wherein said etching of the exposed silicon substrate proceeds to a depth that is approximately 35 percent of the desired final field oxide thickness.

3. The method of claim 2, wherein said oxidation of the silicon substrate is allowed to proceed until the thickness of the oxide formed is approximately four times as great as the original depth of the trenches.

4. The method of claim 3, wherein said spacer-material layer is CVD oxide.

5. The method of claim 4, wherein said spacer-material layer is polycrystalline silicon.

6. The method of claim 4, wherein the etching of the exposed silicon substrate is accomplished using potassium hydroxide.

7. The method of claim 5, wherein the etching of the exposed silicon substrate is accomplished using potassium hydroxide.

8. The method of claim 4, wherein the etching of the exposed silicon substrate is accomplished using an anisotropic silicon etch.

9. The method of claim 5, wherein the etching of the exposed silicon substrate is accomplished using an anisotropic silicon etch.

10. The method of claim 4, wherein the etching of the exposed silicon substrate is accomplished using an isotropic silicon etch.

11. The method of claim 5, wherein the etching of the exposed silicon substrate is accomplished using an isotropic silicon etch.

* * * * *